US009865586B2

(12) United States Patent
Katakura et al.

(10) Patent No.: US 9,865,586 B2
(45) Date of Patent: Jan. 9, 2018

(54) SEMICONDUCTOR DEVICE AND METHOD FOR TESTING THE SEMICONDUCTOR DEVICE

(71) Applicant: FUJI ELECTRIC CO., LTD., Kawasaki-shi (JP)

(72) Inventors: Hideaki Katakura, Matsumoto (JP); Yoshiaki Toyoda, Matsumoto (JP)

(73) Assignee: FUJI ELECTRIC CO., LTD., Kawasaki-Shi (JP)

(*) Notice: Subject to any disclaimer, the term of this patent is extended or adjusted under 35 U.S.C. 154(b) by 65 days.

(21) Appl. No.: 15/041,027

(22) Filed: Feb. 10, 2016

(65) Prior Publication Data

US 2016/0276333 A1    Sep. 22, 2016

(30) Foreign Application Priority Data

Mar. 18, 2015 (JP) .................. 2015-054604

(51) Int. Cl.
*H01L 27/02* (2006.01)
*G01R 31/26* (2014.01)
*H01L 29/735* (2006.01)

(52) U.S. Cl.
CPC ...... *H01L 27/0255* (2013.01); *G01R 31/2601* (2013.01); *H01L 29/735* (2013.01)

(58) Field of Classification Search
CPC ......... H01L 2224/45147; H01L 29/735; H01L 27/228; H01L 27/2472; G01R 31/2601
USPC ................ 324/750.01, 500, 750.15–750.18, 324/762.01–763.01, 754.01, 522, 713, 324/600, 76.11, 718, 719
See application file for complete search history.

(56) References Cited

U.S. PATENT DOCUMENTS 7,405,913 B2 * 7/2008 Tobisaka ............ H01L 27/0259
361/111
8,922,220 B2 * 12/2014 Wang .................. G01R 31/025
324/500

(Continued)

FOREIGN PATENT DOCUMENTS

JP        H03-49257 A      3/1991
JP        2003-078021 A    3/2003

(Continued)

*Primary Examiner* — Melissa Koval
*Assistant Examiner* — Trung Nguyen
(74) *Attorney, Agent, or Firm* — Rabin & Berdo, P.C.

(57) ABSTRACT

A semiconductor device and a method for testing the semiconductor device are provided. The semiconductor device includes a diode (protection element) and a semiconductor element having a withstand voltage that is higher than that of the diode provided on one and the same first-conductive-type semiconductor substrate, the diode having a second-conductive-type first semiconductor region selectively provided in a front surface layer of the semiconductor substrate. A high concentration region is open in a normal time, but is short-circuited to a potential higher than that of a GND pad through a second wiring layer in a screening test time. Thus, a semiconductor device and a method for testing the semiconductor device are provided, in which a protection element can be prevented from breaking down and initial failure of a device which is formed on one and the same semiconductor substrate as the protection element can be detected accurately.

13 Claims, 10 Drawing Sheets

(56) References Cited

U.S. PATENT DOCUMENTS

2004/0026728 A1     2/2004    Yoshida et al.
2004/0238893 A1    12/2004    Tobisaka et al.

FOREIGN PATENT DOCUMENTS

| JP | 2003-338604 A | 11/2003 |
|----|---------------|---------|
| JP | 2010-287909 A | 12/2010 |

\* cited by examiner

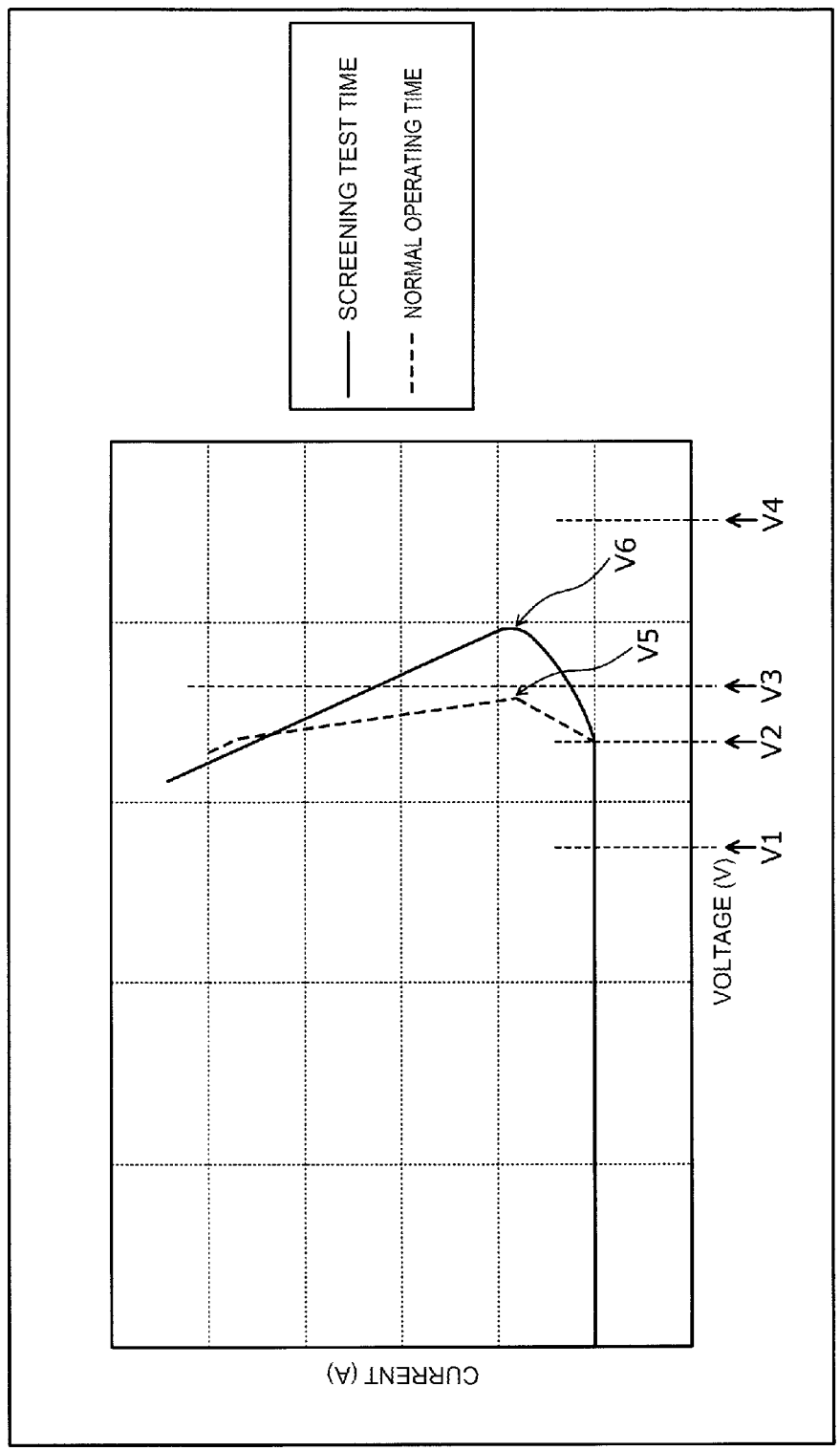

SEMICONDUCTOR DEVICE AND METHOD FOR TESTING THE SEMICONDUCTOR DEVICE

CROSS-REFERENCE TO RELATED APPLICATION

This non-provisional application for a U.S. patent claims the benefit of priority of JP PA 2015-054604 filed Mar. 18, 2015, the entire contents of which is hereby incorporated by reference.

BACKGROUND OF THE INVENTION

1. Field of the Invention

The invention relates to a semiconductor device and a method for testing the semiconductor device.

2. Description of the Related Art

A configuration in which a vertical type MOSFET (Metal Oxide Semiconductor Field Effect Transistor) for an output stage, a horizontal type MOSFET for a control circuit, and a protection element which protects these MOSFETs etc. from surge are formed on one and the same semiconductor chip is well known as the configuration of a power IC (Integrated Circuit). For example, a vertical type diode is used as a protection element of such a power IC. The case where a vertical type diode is used as the structure of a protection element of a semiconductor device according to the background art will be described by way of example. FIGS. 6A and 6B are explanatory views showing the structure of the semiconductor device according to the background art. A planar layout of a protection element 100 according to the background art is shown in FIG. 6A. A sectional structure of the protection element 100 along a cutting plane line Z-Z' of FIG. 6A is shown in FIG. 6B.

As shown in FIGS. 6A and 6B, the background-art protection element 100 is a vertical type diode in which a $p^-$ type anode region 102 is provided on a front surface side of an $n^-$ type semiconductor substrate (semiconductor chip) serving as an $n^-$ type drift layer 101 and an $n^+$ type cathode layer 108 is provided on a back surface side of the $n^-$ type semiconductor substrate (semiconductor chip). A $p^{++}$ type contact region 103 serving as a contact (electric contact portion) with an anode electrode 104 is selectively provided in the vicinity of the center of the $p^-$ type anode region 102 inside the $p^-$ type anode region 102. The $n^+$ type cathode layer 108 is electrically connected to a power supply voltage terminal (hereinafter referred to as Vcc terminal) through a cathode electrode 109. The $p^-$ type anode region 102 is electrically connected to a GND pad (ground terminal) 107 through the $p^{++}$ type contact region 103, the anode electrode 104 and a wiring layer 106. Any other element (an output stage, a control circuit, etc.) than the protection element 100, which is formed on one and the same semiconductor substrate as the protection element 100, is not shown in FIGS. 6A and 6B. The anode electrode 104 and an interlayer dielectric 105 are not shown in FIG. 6A.

When surge applies to a semiconductor device provided with such a background-art protection element 100 through the Vcc terminal, a reserve voltage is applied to a pn junction 111 between the $p^-$ type anode region 102 and the $n^-$ type drift layer 101 so that a depletion layer 112 is spread from the pn junction 111. When the reverse voltage applied to the pn junction 111 exceeds a predetermined voltage (breakdown voltage) larger than a potential difference (diffusion potential) applied between opposite ends of the depletion layer 12, a surge current flows from the $n^+$ type cathode layer 108 into the GND pad 107 via the $n^-$ type drift layer 101, the $p^-$ type anode region 102, the $p^{++}$ type contact region 103, the anode electrode 104 and the wiring layer 106. The protection element 100 is set to break down at a reverse voltage (withstand voltage) lower than the withstand voltage of any other device than the protection element 100, which is formed on one and the same semiconductor substrate as the protection element 100, so that the protection element 100 can protect the other device from the surge. The reference numeral 113 designates a place to which an electric field is apt to be concentrated to thereby lead to occurrence of breakdown.

The following device has been proposed as the semiconductor device provided with the protection element. An n-type semiconductor substrate is divided into an MOSFET region and a guard ring region. A p-type well region is formed in each of the MOSFET region and the guard ring region or at least in the guard ring region. An impurity profile of the p-type well region and an upward diffusion profile of impurities from the $n^+$ type substrate make contact deep enough to hide an impurity profile of an n-type epitaxial layer so that a pn junction diode can be formed. A reverse breakdown voltage of the pn junction diode is set to be higher than a normal operating voltage and lower than the withstand voltage of a semiconductor element (e.g. see JP-A-3-049257 (from line 18 of lower right column in p. 2 to line 4 of upper left column in p. 3, FIG. 1)).

In addition, as another device, a semiconductor device has been proposed as follows (e.g. see JP-A-2010-287909). The semiconductor device is provided with a transistor and a diode which are formed on one and the same substrate and connected in parallel. In the semiconductor device, resistance during a breakdown operation of the diode is made lower than resistance during a breakdown operation of the transistor and a secondary breakdown current of the diode is made higher than a secondary breakdown current of the transistor. In addition, as another device, a device has been proposed as follows (e.g. see JP-A-2003-338604). In the device, a front surface electrode of a vertical type bipolar transistor and a drain electrode of a horizontal type MOSFET are electrically connected by metal electrode wiring. When a high ESD (Electro-Static Discharge) voltage or a high surge voltage is applied, the device absorbs the ESD and surge energy by an operation of the vertical type bipolar transistor and limits the voltage to be not higher than the breakdown voltage of the horizontal type MOSFET which may lead to breakdown.

In addition, as another device, a device has been proposed as follows. An ESD protection circuit has an MISFET and a parasitic bipolar transistor whose base is connected to a high level-side power supply terminal is formed between a channel body of the MISFET and a data input/output terminal. In a normal operating condition in which a positive power supply voltage is given to the high level-side power supply terminal, the parasitic bipolar transistor maintains OFF and the high level-side power supply terminal is open. In an ESD test in which a positive voltage is given to the data input/output terminal, the parasitic bipolar transistor operates (e.g., see JP-A-2003-078021 (paragraph [0029], FIG. 1)). In JP-A-2003-078021, the withstand voltage of the protection element is changed between the normal operating time and the ESD test time.

Assume that a screening test is performed on the aforementioned power IC provided with the background-art protection element to remove a product in which initial failure occurs in another device than the protection element by applying a voltage higher than an operating voltage of the product. In this case, there is a fear that the following problem may arise. For example, the horizontal type MOSFET is formed for the control circuit and on one and the same semiconductor substrate as the protection element. When it is regarded as important to protect the horizontal type MOSFET, the withstand voltage of the vertical type diode constituting the protection element is set to be lower than the withstand voltage of the horizontal type MOSFET. Therefore, when a voltage higher than the operating voltage of the product is applied in the screening test, there is a fear that a large current may flow into the protection element to generate dielectric breakdown etc. to thereby lead to breakdown of the protection element itself. Also in the case where the withstand voltage of the protection element is changed in accordance with the circumstances as in JP-A-2003-078021, there is a fear that the protection element itself may break down because the power IC is high in voltage and large in current.

In order to solve the aforementioned problems inherent in the background art, an object of the invention is to provide a semiconductor device and a method for testing the semiconductor device, in which a protection element can be prevented from breaking down and initial failure of a device formed on one and the same semiconductor substrate as the protection element can be detected accurately.

SUMMARY OF THE INVENTION

In order to solve the aforementioned problems and achieve the object of the invention, the semiconductor device according to the invention has the following characteristics. A diode is formed such that a second conductive type first semiconductor region is selectively provided in a front surface layer of a first conductive type semiconductor substrate. A second conductive type second semiconductor region higher in impurity concentration than the first semiconductor region is selectively provided inside the first semiconductor region. A first conductive type third semiconductor region is selectively provided inside the first semiconductor region, separately from the second semiconductor region and outside the second semiconductor region. A first electrode is electrically connected to the second semiconductor region and connected to a first potential. A second electrode is electrically connected to the semiconductor substrate and connected to a second potential higher than the first potential. A third electrode of a floating potential is electrically connected to the third semiconductor region.

In addition, according to the invention, there is provided a semiconductor device having the aforementioned configuration, further including: a second conductive type fourth semiconductor region which is higher in impurity concentration than the first semiconductor region and which is selectively provided inside the first semiconductor region, separately from the third semiconductor region and outside the third semiconductor region.

In addition, according to the invention, there is provided a semiconductor device having the aforementioned configuration, further including: a first conductive type fifth semiconductor region and a fourth electrode. The fifth semiconductor region is selectively provided between the second semiconductor region and the third semiconductor region inside the first semiconductor region. The fourth electrode is electrically connected to the fifth semiconductor region and connected to the first potential.

In addition, according to the invention, there is provided a semiconductor device having the aforementioned configuration, further including: a semiconductor element which is higher in withstand voltage than the diode and which is provided on one and the same semiconductor substrate as the diode. In a test time for checking characteristics of the semiconductor element, the third electrode is connected to a third potential higher than the first potential and a predetermined voltage is applied to the semiconductor element through the second electrode.

In addition, according to the invention, there is provided a semiconductor device having the aforementioned configuration, further including: a semiconductor element which is higher in withstand voltage than the diode and which is provided on one and the same semiconductor substrate as the diode. In a test time for checking characteristics of the semiconductor element, the third electrode is connected to a third potential higher than the first potential and a predetermined voltage is applied to the semiconductor element through the second electrode. On this occasion, impurity concentration of the second semiconductor region and/or impurity concentration of the third semiconductor region are set so that a parasitic bipolar diode including the semiconductor substrate, the second semiconductor region and the fifth semiconductor region can snap back at a voltage higher than the predetermined voltage in the test.

In order to solve the aforementioned problems and achieve the object of the invention, the method for testing the semiconductor device according to the invention is a method for testing a semiconductor device in which a diode and a semiconductor element higher in withstand voltage than the diode are provided on one and the same first conductive type semiconductor substrate. The method for testing the semiconductor device has the following characteristics. The diode has a second conductive type first semiconductor region selectively provided in a front surface layer of the semiconductor substrate. Further, the diode is provided with a second conductive type second semiconductor region and a first conductive type third semiconductor region. The second semiconductor region is selectively provided inside the first semiconductor region and higher in impurity concentration than the first semiconductor region. The third semiconductor region is selectively provided inside the first semiconductor region, separately from the second semiconductor region and outside the second semiconductor region. In a test time for checking characteristics of the semiconductor element, a first potential is applied to the second semiconductor region, a second potential higher than the first potential is applied to the semiconductor substrate to thereby apply a predetermined voltage to the semiconductor element, and a third potential higher than the first potential is applied to the third semiconductor region.

In addition, according to the invention, there is provided a method for testing a semiconductor device having the aforementioned configuration, wherein: the predetermined voltage is higher than a reverse voltage at which the diode may break down.

According to the aforementioned configuration, the third semiconductor region of the floating potential which is selectively provided in the first semiconductor region of the diode is short-circuited to the third potential higher than the first potential in the screening test time. Accordingly, even when the diode breaks down in the screening test time, a current flowing into the diode can be suppressed. Thus, a high screening test voltage can be applied to any other device than the diode, which is formed on one and the same semiconductor substrate as the diode, in a state in which heating of the protection element is suppressed. In addition, according to the aforementioned configuration, a high screening test voltage can be applied to the other device than the diode, which is formed on one and the same semiconductor substrate as the diode, also in the case where an npn parasitic bipolar transistor is formed in the protection element to improve surge current absorbing capability.

According to the semiconductor device and the method for testing the semiconductor device according to the invention, it is possible to obtain an effect that a protection element can be prevented from breaking down and initial failure of a device, which is formed on one and the same semiconductor substrate as the protection element, can be detected accurately.

BRIEF DESCRIPTION OF THE DRAWINGS

FIG. 5 is a characteristic graph showing characteristics of a withstand voltage of a protection element formed in the semiconductor device according to Embodiment 3.

DETAILED DESCRIPTION OF THE INVENTION

Preferred embodiments of a semiconductor device and a method for testing the semiconductor device according to the invention will be described below in detail with reference to the accompanying drawings. In the description of the invention and the accompanying drawings, a layer or region prefixed with n or p means that electrons or holes are majority carriers in that layer or region. In addition, layers or regions designated by n or p suffixed with $^+$ and $^-$ mean a higher impurity concentration and a lower impurity concentration than layers or regions designated by n or p suffixed without $^+$ and $^-$. Incidentally, in the following description of the embodiments and the accompanying drawings, similar constituents will be referred to by the same numerals or signs respectively and correspondingly and duplicate description thereof will be omitted.

Embodiment 1

Figure 1A:
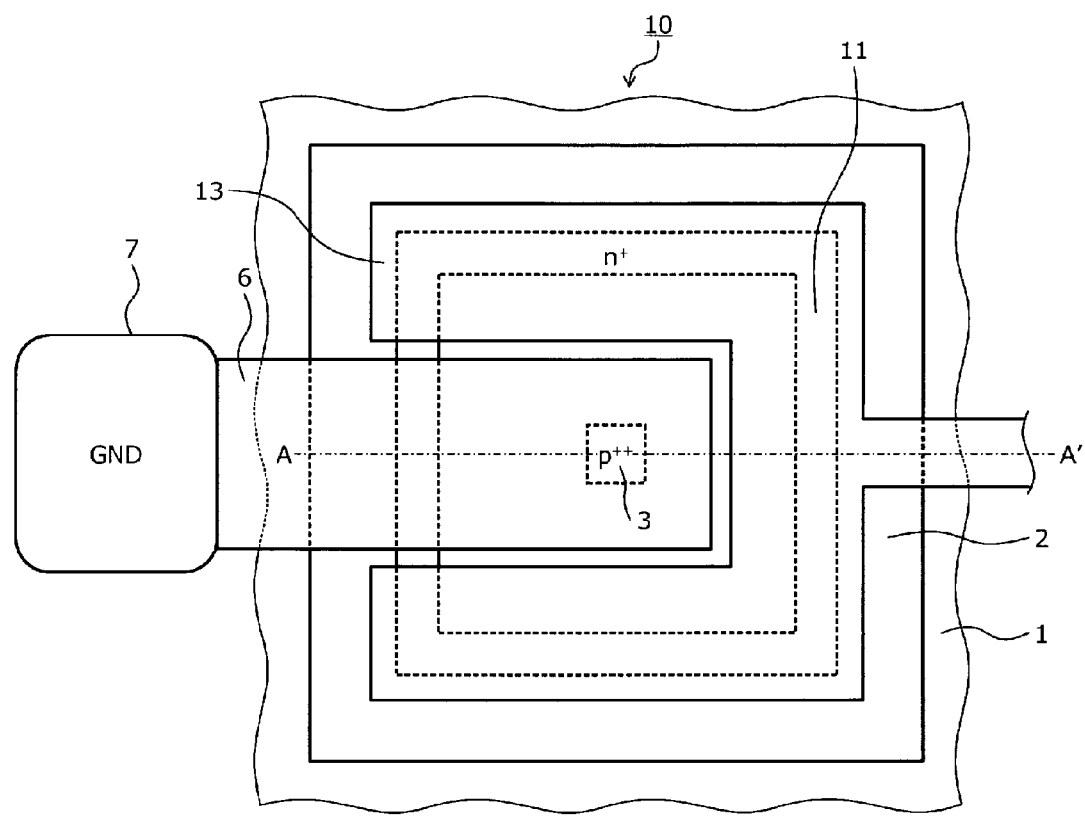
FIGS. 1A and 1B are explanatory views showing the structure of a semiconductor device according to Embodiment 1.
Figure 1B:
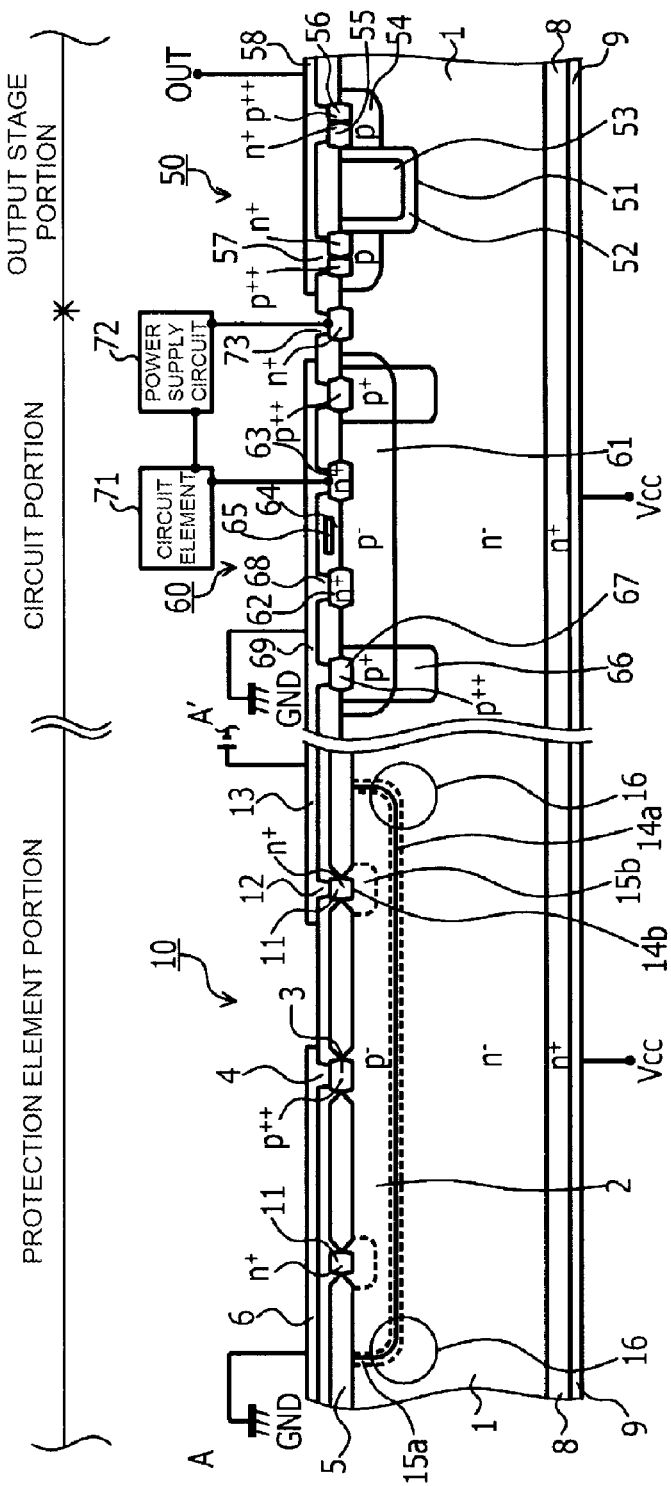

A semiconductor device according to Embodiment 1 will be described. FIGS. 1A and 1B are explanatory views showing the structure of the semiconductor device according to Embodiment 1. A sectional structure of an in-vehicle high-side type power IC as an example of the semiconductor device according to Embodiment 1 is shown in FIG. 1B. In the in-vehicle high-side type power IC, a vertical type n-channel power MOSFET for an output stage, a horizontal type CMOS (Complementary MOS) for a control circuit, and a protection element 10 which protects these MOSFETs from surge are provided on one and the same semiconductor substrate (semiconductor chip). FIG. 1A shows a planar layout of the protection element 10 (in which an anode electrode 4 and an interlayer dielectric 5 are not shown).

FIG. 1B shows a sectional structure of the protection element 10 along a cutting plane line A-A' of FIG. 1A. A state of the protection element 10 in a screening test time for removing a product in which initial failure occurs in any other device than the protection element 10 is shown in FIG. 1B. The initial failure means that characteristic change different from product specification occurs.

As shown in FIGS. 1A and 1B, the semiconductor device according to Embodiment 1 is provided with an output stage portion, a circuit portion and a protection element portion which are disposed separately from one another on an n$^-$ type semiconductor substrate (semiconductor chip) serving as an n$^-$ type drift layer 1 for the protection element 10 and a vertical type MOSFET 50 which will be described later. For example, the vertical type MOSFET 50 having a trench gate structure is disposed as the vertical type n-channel power MOSFET for the output stage in the output stage portion. An MOS gate structure of the vertical type MOSFET 50 is provided on a substrate front surface side in the output stage portion. The MOS gate structure of the vertical type MOSFET 50 is a general trench gate structure including a trench 51, a gate insulating film 52, a gate electrode 53, a p-type base region 54, an n$^+$ type source region 55 and a p$^{++}$ type contact region 56.

The n$^+$ type source region 55 and the p$^{++}$ type contact region 56 of the vertical type MOSFET 50 are connected to a source electrode 57 and electrically connected to a not-shown output pad (output (OUT) terminal) provided on the substrate front surface side through a first source wiring layer 58. An n$^+$ type semiconductor layer 8 is provided all over a back surface of the n$^-$ type semiconductor substrate. A back surface electrode 9 is provided all over a front surface of the n$^+$ type semiconductor layer 8. The n$^+$ type semiconductor layer 8 functions as a drain layer of the vertical type MOSFET 50. The back surface electrode 9 is connected to a power supply voltage terminal (hereinafter referred to as Vcc terminal) having a potential (second potential) higher than a potential of a GND pad 7. The back surface electrode 9 functions as a drain electrode of the vertical type MOSFET 50.

Various circuits such as the horizontal type CMOS for the control circuit, a circuit element 71 and a power supply circuit 72 are provided in the circuit portion. Of a horizontal type p-channel MOSFET and a horizontal type n-channel MOSFET which are complementarily connected and constitute the horizontal type CMOS for the control circuit, only a horizontal type n-channel MOSFET 60 is illustrated here. A p$^-$ type base region 61 is selectively provided in a front surface layer of the substrate front surface in the circuit portion. An MOS gate structure of the horizontal type n-channel MOSFET 60 is provided in the p$^-$ type base region 61. The MOS gate structure of the horizontal type n-channel MOSFET 60 is a general planar gate structure including an n$^+$ type source region 62, an n$^+$ type drain region 63, a gate insulating film 64 and a gate electrode 65.

In addition, a p$^+$ type diffusion region 66 which penetrates the p$^-$ type base region 61 in a depthwise direction is provided in the p$^-$ type base region 61 so as to surround the horizontal type n-channel MOSFET 60. The p$^+$ type diffusion region 66 functions as a guard ring for securing a withstand voltage of the horizontal type n-channel MOSFET 60. A p$^{++}$ type contact region 67 is selectively provided inside the p$^+$ type diffusion region 66. A source electrode 68 is electrically connected to the p$^-$ type base region 61 which is a back gate, through the n$^+$ type source region 62, the p$^+$ type diffusion region 66 and the p$^{++}$ type contact region 67.

In addition, the source electrode 68 is electrically connected to the GND pad 7 through a second source wiring layer 69.

Respective elements of the circuit element 71 such as the horizontal type p-channel MOSFET constituting the horizontal type CMOS for the control circuit, a depletion type MOSFET and a resistance element are electrically connected to the $n^+$ type drain region 63 of the horizontal type n-channel MOSFET 60 through a drain electrode (not shown) to thereby form various inverter circuits. The circuit element 71 is connected to a high potential-side $n^+$ type diffusion region 73 through the power supply circuit 72. The high potential-side $n^+$ type diffusion region 73 is selectively provided in the front surface layer of the substrate front surface. The power supply circuit 72 is constituted by a high withstand voltage circuit element (not shown). Upon reception of a power supply potential (the potential of the Vcc terminal), the power supply circuit 72 outputs a low potential to the circuit element 71 to supply a power supply voltage to the various inverter circuits.

The protection element 10 is provided in the protection element portion. The protection element 10 is a vertical type diode in which a $p^-$ type anode region (first semiconductor region) 2 is provided in the front surface of the $n^-$ type semiconductor substrate ($n^-$ type drift layer 1) and the $n^+$ type semiconductor layer 8 serving as a cathode layer is provided in the back surface of the $n^-$ type semiconductor substrate ($n^-$ type drift layer 1). The protection element 10 is set to have a withstand voltage lower than the withstand voltage of any other device (for example, the vertical type MOSFET 50 for the output stage, the horizontal type CMOS for the control circuit, etc.) than the protection element 10, which is formed on one and the same semiconductor substrate as the protection element 10. The protection element 10 has a function of protecting the other device from surge. Specifically, the $p^-$ type anode region 2 is selectively provided in the surface layer of the front surface of the $n^-$ type semiconductor substrate. A $p^{++}$ type contact region (second semiconductor region) 3 is selectively provided inside the $p^-$ type anode region 2 so as to be exposed in the substrate front surface. The $p^{++}$ type contact region 3 may be provided, for example, in the vicinity of the center of the $p^-$ type anode region 2. The $p^{++}$ type contact region 3 is a high concentration region for making contact with the anode electrode 4. The anode electrode (first electrode) 4 makes contact with the $p^{++}$ type contact region 3 and is electrically connected to the GND pad 7 through a first wiring layer 6. The first wiring layer 6 is disposed, for example, with a planar layout of a straight linear shape extending from the anode electrode 4 toward the GND pad 7. The GND pad 7 is disposed, for example, outside a region where the protection element 10 is formed.

In addition, an $n^+$ type high concentration region (third semiconductor region) 11 is selectively provided inside the $p^-$ type anode region 2 and separately from the $p^{++}$ type contact region 3 so as to be exposed in the substrate front surface. The $n^+$ type high concentration region 11 is connected to a potential (third potential) higher than the potential (first potential) of the GND pad 7 in a screening test time. The $n^+$ type high concentration region 11 has a function of limiting a current flowing into the $p^-$ type anode region 2. The $n^+$ type high concentration region 11 is preferably disposed not on the side of the $p^{++}$ type contact region 3 but on the side of a corner portion 16 of the $p^-$ type anode region 2 (cathode side outer circumferential end of the $p^-$ type anode region 2) where an electric field is apt to be concentrated. For example, the $n^+$ type high concentration region 11 may be disposed with a planar layout of a substantially rectangular ring shape surrounding the $p^{++}$ type contact region 3. In addition, the $n^+$ type high concentration region 11 may be disposed with a planar layout (for example, a substantially rectangular shape which is partially opened (hereinafter referred to as opened rectangular shape)) opposed to a part of the circumference of the $p^{++}$ type contact region 3 with the interposition of the $p^-$ type anode region 2. The substrate front surface between the $p^{++}$ type contact region 3 and the $n^+$ type high concentration region 11 and between the $n^+$ type high concentration region 11 and the other device is covered with a thick interlayer dielectric 5, for example, made of LOCOS (Local Oxidation of Silicon).

A contact electrode (third electrode) 12 makes contact with the $n^+$ type high concentration region 11 and is electrically insulated from the anode electrode 4 by the interlayer dielectric 5. In addition, the contact electrode 12 is electrically connected, for example, to high potential wiring (not shown) of the control circuit, an external pad (not shown), etc. through a second wiring layer 13. The contact electrode 12 may be disposed, for example, with the same planar layout as that of the $n^+$ type high concentration region 11. On this occasion, the contact electrode 12 and the first wiring layer 6 are electrically insulated from each other by an insulating layer (not shown) in a portion where the $n^+$ type high concentration region 11 and the first wiring layer 6 are opposed to each other in the depthwise direction. In addition, the contact electrode 12 may be disposed, for example, with a different planar layout from that of the $n^+$ type high concentration region 11 so as to make contact with a part of the $n^+$ type high concentration region 11. When, for example, the $n^+$ type high concentration region 11 is disposed with the planar layout of the substantially rectangular ring shape, the contact electrode 12 may be disposed, for example, with a planar layout of an opened rectangular shape making contact with three sides of the $n^+$ type high concentration region 11 so as not to be depthwisely opposed to the first wiring layer 6 which is disposed to intersect the remaining one side of the $n^+$ type high concentration region 11.

In a normal time (in a time of use as a product), the contact electrode 12 is in an opened (opened) state to be in a floating potential. Therefore, the $n^+$ type high concentration region 11 becomes the floating potential so that a depletion layer 15$b$ is not spread from a second pn junction 14$b$ between the $p^-$ type anode region 2 and the $n^+$ type high concentration region 11. On the other hand, in a screening test time, the contact electrode 12 is short-circuited (closed) to a higher potential point than that of the GND pad 7 so that a predetermined voltage is applied to the contact electrode 12. For example, a voltage is applied to the contact electrode 12 through the second wiring layer 13 from the high potential wiring of the control circuit or the external pad which serves as the higher potential point than that of the GND pad 7. Thus, the $n^+$ type high concentration region 11 is connected to the higher potential than that of the GND pad 7 so that the depletion layer 15$b$ is spread from the second pn junction 14$b$ between the $p^-$ type anode region 2 and the $n^+$ type high concentration region 11. That is, the contact electrode 12 is used as a pad for the screening test.

It may go well as long as the second wiring layer 13 is electrically insulated from the first wiring layer 6. The planar layout of the second wiring layer 13 may be changed variously in accordance with the planar layout of the contact electrode 12. For example, the second wiring layer 13 may be disposed with a planar layout in which the second wiring layer 13 is pulled out, for example, in an opened rectangular shape making contact with a front surface of the contact electrode 12 and in a straight linear shape extending from one side of the opened rectangular shape toward the outer side (the side of the high potential wiring of the control circuit or the external pad). The configuration in which the contact electrode 12 and the high potential wiring of the control circuit or the external pad are electrically connected through the second wiring layer 13 may be replaced by a configuration in which control is made to short-circuit the contact electrode 12 and the n⁻ type semiconductor substrate of the power supply voltage potential through the second wiring layer 13 in the screening test time. The back surface electrode 9 functions as a cathode electrode (second electrode) of the protection element 10.

Figure 2:
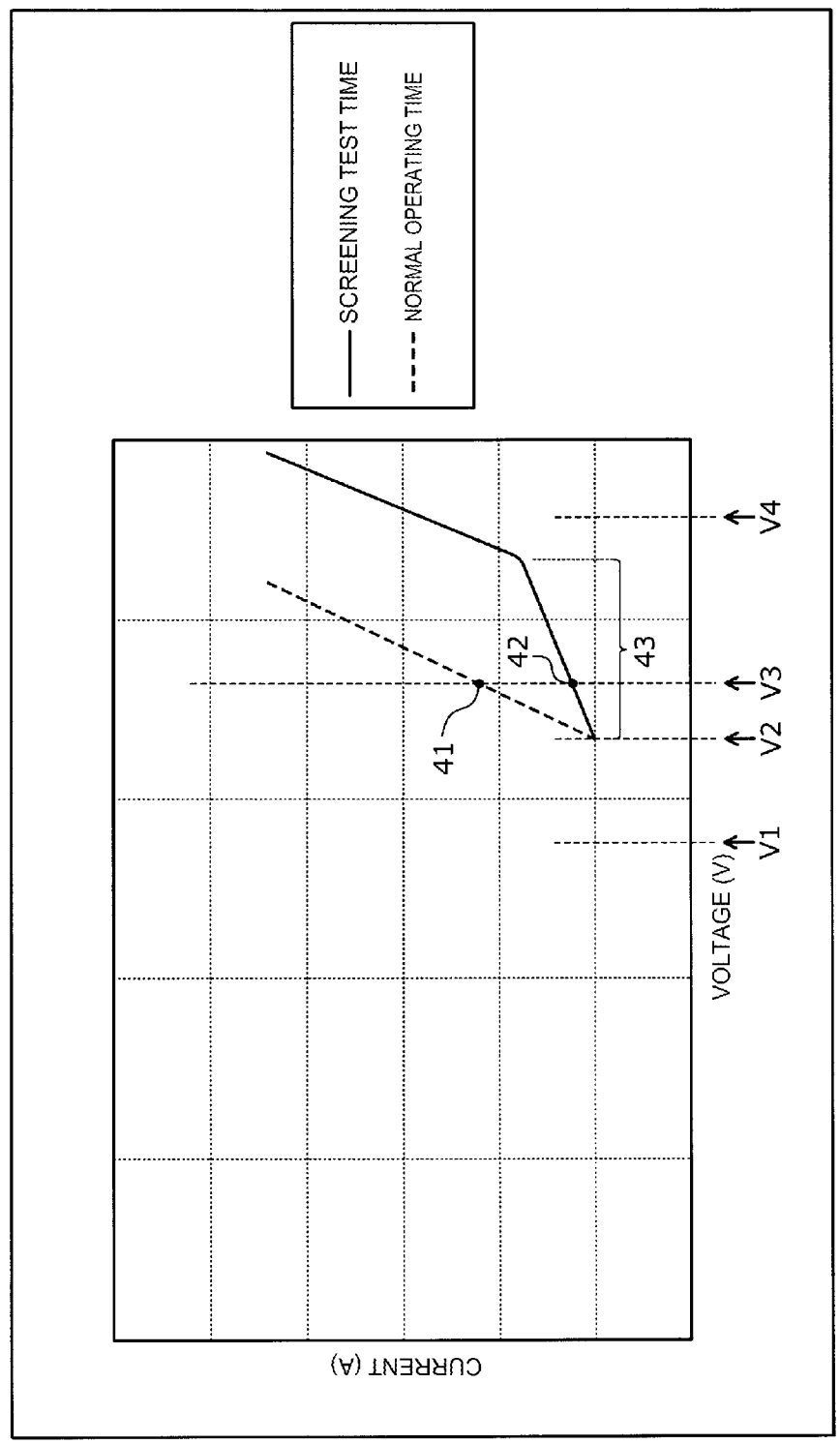
FIG. 2 is a characteristic graph showing characteristics of a withstand voltage of a protection element formed in the semiconductor device according to Embodiment 1.

Next, operation of the protection element 10 will be described. FIG. 2 is a characteristic graph showing characteristics of the withstand voltage of the protection element formed in the semiconductor device according to Embodiment 1. When surge applies to a semiconductor device through the Vcc terminal in a normal time, a reverse voltage is applied to a first pn junction 14a between the p⁻ type anode region 2 and the n⁻ type drift layer 1 so that a depletion layer 15a is spread from the first pn junction 14a. When the reverse voltage applied to the first pn junction 14a exceeds a predetermined voltage (breakdown voltage) V2 larger than a potential difference (diffusion potential) applied to opposite ends of the depletion layer 15a, breakdown occurs in the corner portion 16 of the p⁻ type anode region 2 where an electric field is apt to be concentrated. A surge current flows from the n⁺ type cathode layer (n⁺ type semiconductor layer 8) into the GND pad 7 through the n⁻ type drift layer 1, the p⁻ type anode region 2, the p⁺⁺ type contact region 3, the anode electrode 4 and the first wiring layer 6 in the named order due to the breakdown caused by the first pn junction 14a. The surge current flowing into the protection element 10 increases linearly with a predetermined slope in accordance with the increase of the reverse voltage applied to the first pn junction 14a. The protection element 10 is set to break down at the breakdown voltage (withstand voltage) V2 lower than a withstand voltage V4 of any other device than the protection element 10, which is formed on one and the same semiconductor substrate as the protection element 10. Therefore, the surge current is absorbed by the protection element 10 so that a large current can be prevented from flowing into any other device than the protection element 10, which is formed on one and the same semiconductor substrate as the protection element 10. In addition, in the normal time, the contact element 12 is opened to be in a floating state. Therefore, When surge applies to a semiconductor device through the Vcc terminal, the depletion layer 15b is not spread from the second pn junction 14b between the p⁻ type anode region 2 and the n⁺ type high concentration region 11. That is, since a surge current flowing into the protection element 10 is not limited in the normal time, surge current absorbing capability performed by the protection element 10 is not deteriorated. Operating resistance of the protection element 10 in the normal time is determined based on impurity concentration of the p⁻ type anode region 2, etc.

On the other hand, in order to check operation of any other device than the protection element 10 inside the product in the screening test time, a voltage (hereinafter referred to as screening test voltage) V3 not lower than an operating voltage V1 of the product and not higher than the withstand voltage V4 of any other device than the protection element 10 is applied to the Vcc terminal. For example, when the operating voltage V1 of the product is about 15 V, the screening test voltage V3 may be about 20 V. Thus, the reverse voltage is applied to the first pn junction 14a between the p⁻ type anode region 2 and the n⁻ type drift layer 1 in the same manner as in the normal time so that the depletion layer 15a is spread from the first pn junction 14a. Therefore, when breakdown caused by the first pn junction 14a occurs, a current flows from the cathode side toward the GND pad 7 in the same manner as in the normal time. On this occasion, in the invention, a higher potential than that of the GND pad 7 is applied, for example, from the external pad to the contact electrode 12 through the second wiring layer 13 so that the n⁺ type high concentration region 11 can be connected to the higher potential than that of the GND pad 7. Thus, a current flowing into the p⁻ type anode region 2 is limited. Specifically, when the n⁺ type high concentration region 11 is connected to the higher potential than that of the GND pad 7, a reverse voltage is applied to the second pn junction 14b between the p⁻ type anode region 2 and the n⁺ type high concentration region 11 to spread the depletion layer 15b also from the second pn junction 14b. Thus, in a range 43 from the breakdown voltage V2 to a predetermined voltage larger than the screening test voltage V3, an increase amount (slope) of a current flowing into the protection element 10 is smaller than an increase amount of a current flowing into the protection element 10 in the normal time. Therefore, a current 42 flowing into the protection element 10 in the screening test time can be made smaller than a current 41 flowing into the protection element 10 when the same voltage as the screening test voltage V3 is applied in the normal time. That is, even when breakdown caused by the first pn junction 14a occurs in the screening test time, a current flowing into the p⁻ type anode region 2 is limited by the depletion layer 15b spread from the second pn junction 14b, so that the operating resistance of the protection element 10 can be increased. That is, the operating resistance of the protection element 10 in the screening test time is determined based on impurity concentration of the p⁻ type anode region 2 and impurity concentration of the n⁺ type high concentration region 11, etc. For example, the screening test is originally performed at the screening test voltage V3 in which the protection element 10 does not operate. However, the breakdown voltage V2 of the protection element 10 may be smaller than the screening test voltage V3 (V2<V3) due to a variation of the operating voltage V1 of the device or the breakdown voltage V2 of the protection element 10. In such a case, it is possible to prevent the protection element 10 from generating heat to lead to breakdown.

According to Embodiment 1 as described above, the n⁺ type high concentration region of the floating potential selectively provided in the p⁻ type anode region of the diode constituting the protection element is short-circuited to the higher potential than that of the GND pad in the screening test time. Accordingly, a current flowing into the protection element can be suppressed even when the protection element breaks down in the screening test time. Thus, a large current can be prevented from flowing into the protection element. A high screening test voltage can be applied to any other device than the protection element, which is formed on one and the same semiconductor substrate as the protection element, in the state in which heating of the protection element is suppressed. Thus, characteristic change of any other device than the protection element can be checked. Accordingly, the protection element itself can be prevented from breaking down and the product including initial failure can be screened accurately. In addition, since the n⁺ type high concentration region is kept open in the normal time, a current flowing into the protection element is not suppressed. Accordingly, any other device than the protection element, which is formed on one and the same semiconductor substrate as the protection element, can be protected from surge.

Embodiment 2

Figure 3A:
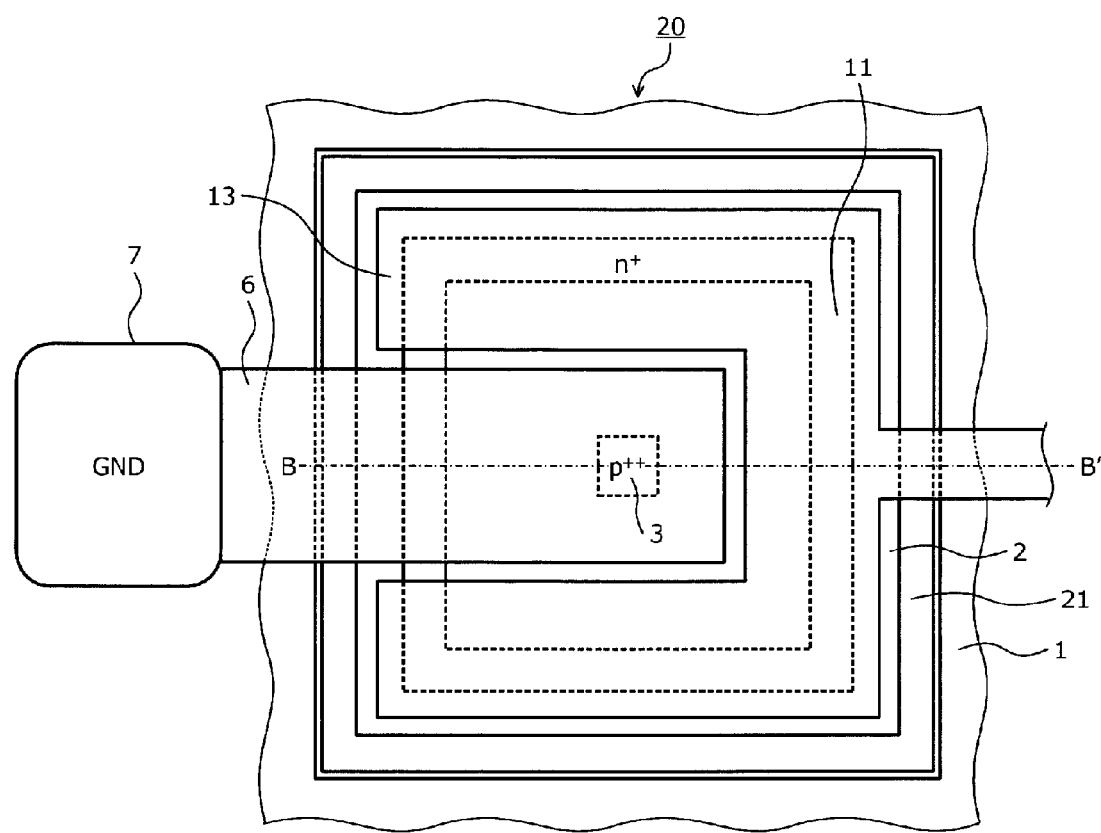
FIGS. 3A and 3B are explanatory views showing the structure of a semiconductor device according to Embodiment 2.
Figure 3B:
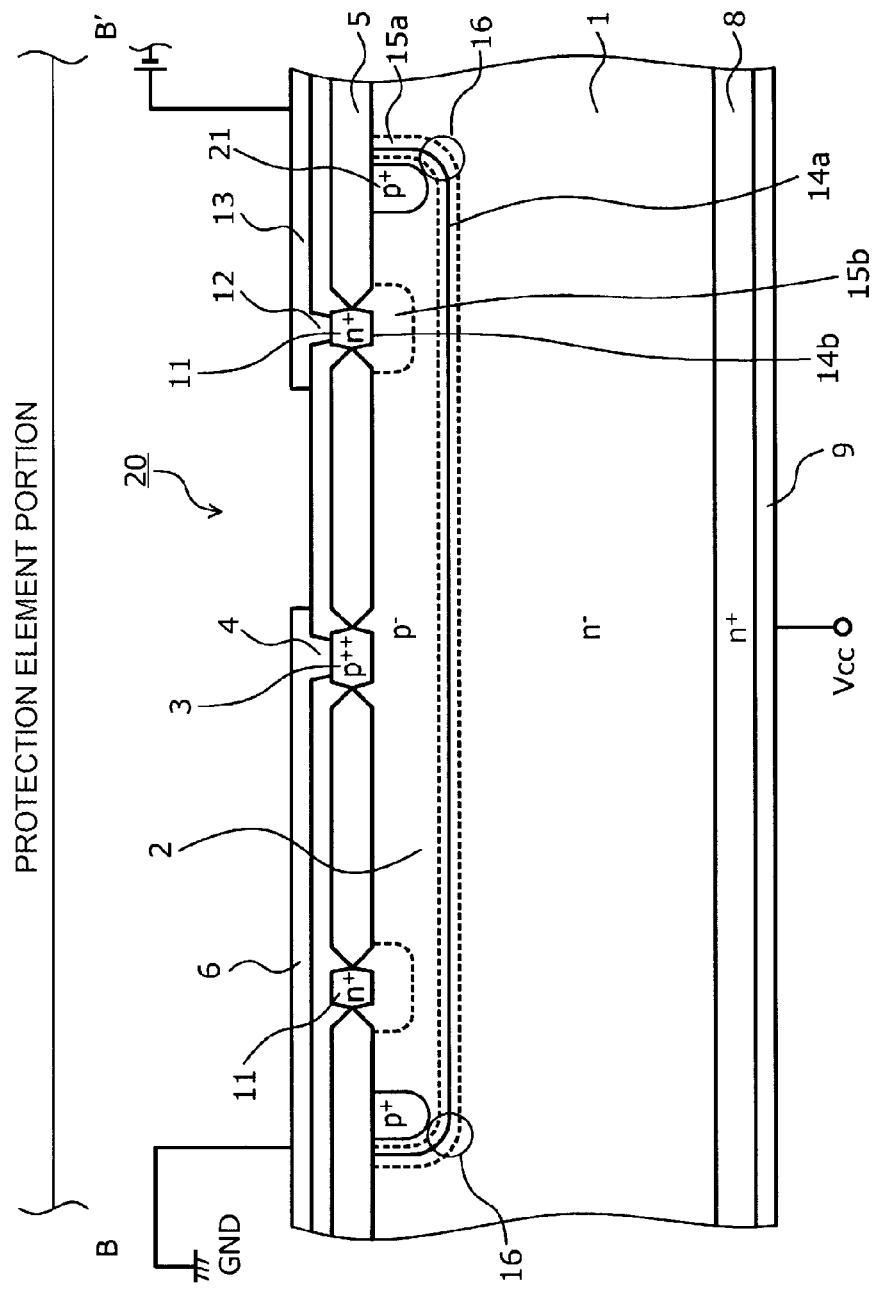

Next, the structure of a semiconductor device according to Embodiment 2 will be described. FIGS. 3A and 3B are explanatory views showing the structure of the semiconductor device according to Embodiment 2. FIG. 3A shows a planar layout of a protection element 20 (in which an anode electrode 4 and an interlayer dielectric 5 are not shown). FIG. 3B shows a sectional structure of the protection element 20 along a cutting plane line B-B' of FIG. 3A. FIG. 3B is a state of the protection element 20 in a screening test time. The protection element 20 formed in the semiconductor device according to Embodiment 2 is different from the protection element 10 according to Embodiment 1 in the point that a $p^+$ type high concentration region (fourth semiconductor region) 21 higher in impurity concentration than a $p^-$ type anode region 2 is selectively provided inside the $p^-$ type anode region 2, separately from an $n^+$ type high concentration region 11, and outside the $n^+$ type high concentration region 11.

The $p^+$ type high concentration region 21 is disposed to be almost as deep as the $p^-$ type anode region 2 from a substrate front surface in the vicinity of an outer circumference of the $p^-$ type anode region 2. In addition, the $p^+$ type high concentration region 21 is disposed to be so far from the $n^+$ type high concentration region 11 that a depletion layer 15b spread from a second pn junction 14b between the $p^-$ type anode region 2 and the $n^+$ type high concentration region 11 cannot reach the $p^+$ type high concentration region 21. Any position may be used as the position of the $p^+$ type high concentration region 21 in a horizontal direction (direction parallel to the substrate front surface) perpendicular to the depthwise direction, as long as p-type impurity concentration in the vicinity of the outer circumference of the $p^-$ type anode region 2 can be increased by the $p^+$ type high concentration region 21. Therefore, the $p^+$ type high concentration region 21 may make contact with an $n^-$ type drift layer 1 in the horizontal direction, or may be positioned slightly on the inner side of an outer circumferential end of the $p^-$ type anode region 2, or may project slightly on the outer side of the outer circumferential end of the $p^-$ type anode region 2. FIGS. 3A and 3B show the case where the $p^+$ type high concentration region 21 is positioned slightly on the inner side of the outer circumferential end of the $p^-$ type anode region 2 (that is, the $p^-$ type anode region 2 is present between the $p^+$ type high concentration region 21 and the $n^-$ type drift layer 1 in the horizontal direction). In addition, any depth may be used as the depth of the $p^+$ type high concentration region 21 as long as the p-type impurity concentration in the vicinity of a corner portion 16 of the $p^-$ type anode region 2 can be increased by the $p^+$ type high concentration region 21. Therefore, the $p^+$ type high concentration region 21 may make contact with the $n^-$ type drift layer 1 in the depthwise direction, or may be slightly shallower than the depth of the $p^-$ type anode region 2, or may be slightly deeper than the depth of the $p^-$ type anode region 2. The $p^+$ type high concentration region 21 may be disposed with a planar layout of a substantially rectangular ring shape surrounding the circumference of the $n^+$ type high concentration region 11 or may be disposed on a part of the vicinity of the outer circumference of the $p^-$ type anode region 2.

Next, operation of the protection element 20 will be described. Operation of the protection element 20 is different from operation of the protection element 10 according to Embodiment 1 in the point that a breakdown place caused by a first pn junction 14a between the $p^-$ type anode region 2 (or the $p^-$ type anode region 2 and the $p^+$ type high concentration region 21) and the $n^-$ type drift layer 1 is limited to the corner portion 16 of the $p^-$ type anode region 2. In Embodiment 2, the $p^+$ type high concentration region 21 is provided in the vicinity of the outer circumference of the $p^-$ type anode region 2. Accordingly, p-type impurity concentration in the vicinity of the corner portion 16 of the $p^-$ type anode region 2 is higher than impurity concentration in the vicinity of a center portion of the $p^-$ type anode region 2. Therefore, a current flowing into the protection element 20 in a breakdown time caused by the first pn junction 14a enters the $p^-$ type anode region 2 from the $n^-$ type drift layer 1 via a high p-type impurity concentration portion of the corner portion 16 of the $p^-$ type anode region 2, that is, via the $p^+$ type high concentration region 21. Then, the current passes through a lower side of the $n^+$ type high concentration region 11 and moves toward a $p^{++}$ type contact region 3. Thus, the breakdown place which may appear when a reverse voltage applied to the first pn junction 14a exceeds a breakdown voltage V2 can be surely limited to the corner portion 16 of the $p^-$ type anode region 2. Therefore, in the screening test time, the current flowing into the $p^-$ type anode region 2 due to the breakdown caused by the first pn junction 14a flows from the corner portion 16 of the $p^-$ type anode region 2 into the $p^{++}$ type contact region 3 through a space between depletion layers 15a and 15b spread from the first and second pn junctions 14a and 14b respectively. On this occasion, the current flowing into the $p^-$ type anode region 2 passes through the vicinity of the depletion layer 15b spread from the second pn junction 14b, so that the current flowing into the $p^-$ type anode region 2 can be suppressed. Accordingly, the current flowing into the $p^-$ type anode region 2 can be controlled more effectively so that operating resistance of the protection element 20 can be further increased.

According to Embodiment 2 as described above, the same effect as that in Embodiment 1 can be obtained.

Embodiment 3

Figure 4A:
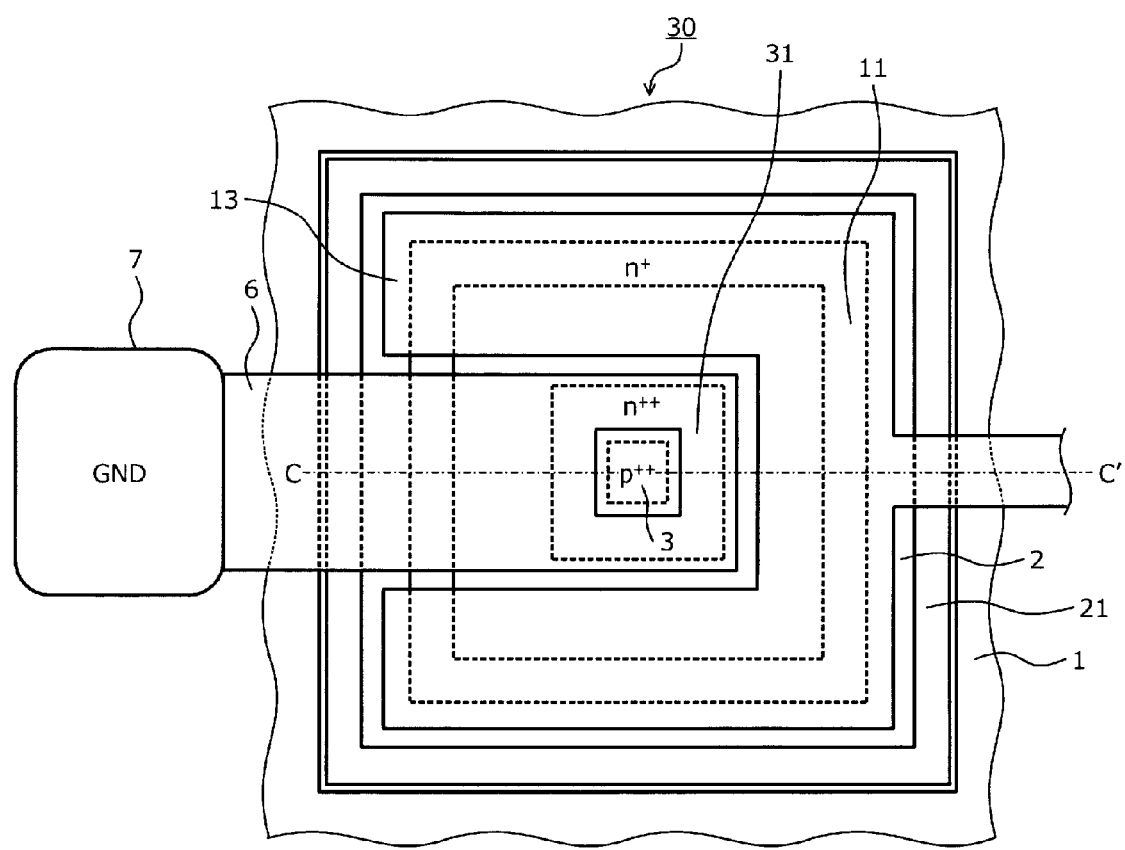
FIGS. 4A and 4B are explanatory views showing the structure of a semiconductor device according to Embodiment 3.
Figure 4B:
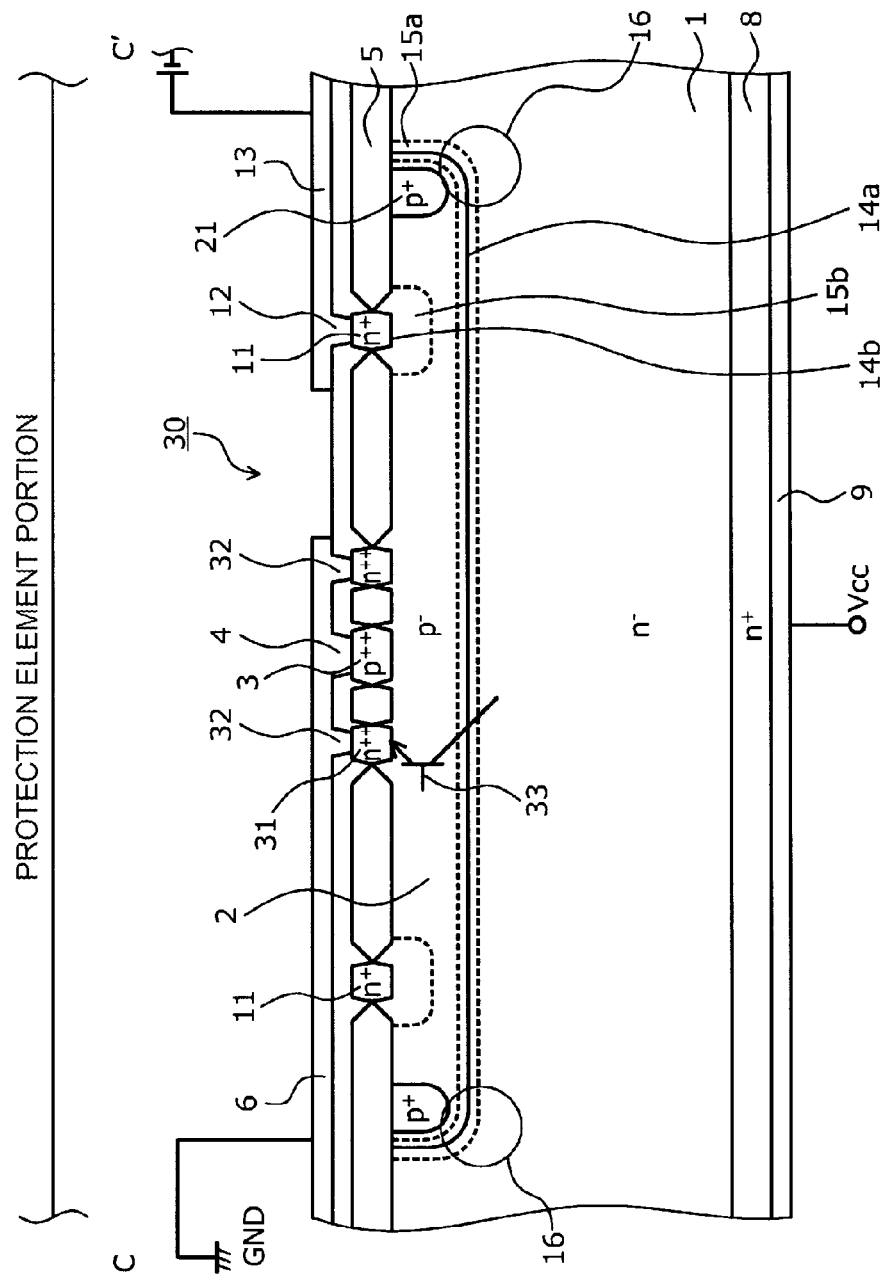

Next, the structure of a semiconductor device according to Embodiment 3 will be described. FIGS. 4A and 4B are explanatory views showing the structure of the semiconductor device according to Embodiment 3. FIG. 4A shows a planar layout of a protection element 30 (in which an anode electrode 4 and an interlayer dielectric 5 are not shown). FIG. 4B shows a sectional structure of the protection element 30 along a cutting plane line C-C' of FIG. 4A. FIG. 4B is a state of the protection element 30 in a screening test time. The protection element 30 formed in the semiconductor device according to Embodiment 3 is different from the protection element 20 according to Embodiment 2 in the point that an $n^{++}$ type high concentration region (hereinafter referred to as low potential $n^{++}$ type region (fifth semiconductor region)) 31 which is equal in potential to a GND pad 7 is selectively provided between a $p^{++}$ type contact region 3 and an $n^+$ type high concentration region 11.

The low potential $n^{++}$ type region 31 is exposed in a substrate front surface inside a $p^-$ type anode region 2 and disposed separately from the $p^{++}$ type contact region 3 and the $n^+$ type high concentration region 11. The low potential $n^{++}$ type region 31 is electrically connected to the GND pad 7 through a contact electrode (fourth electrode) 32 and a first wiring layer 6. The low potential $n^{++}$ type region 31 functions as an emitter of an npn parasitic bipolar transistor 33 which uses an n⁻ type drift layer 1 as its collector and the p⁻ type anode region 2 as its base when a current flows into the low potential n⁺⁺ type region 31. The low potential n⁺⁺ type region 31 may be disposed, for example, with a planar layout of a substantially rectangular ring shape surrounding the p⁺⁺ type contact region 3 or may be disposed with a planar layout (e.g. an opened rectangular shape) opposed to a part of the circumference of the p⁺⁺ type contact region 3 with the interposition of the p⁻ type anode region 2. The substrate front surface is covered with the interlayer dielectric 5 between the low potential n⁺⁺ type region 31 and the n⁺ type high concentration region 11. The contact electrode 32 makes contact with the low potential n⁺⁺ type region 31 and is electrically connected to the GND pad 7 through the first wiring layer 6. In addition, the contact electrode 32 is electrically insulated from a contact electrode 12 by the interlayer dielectric 5. The contact electrode 32 may be disposed, for example, with the same planar layout as that of the n⁺ type high concentration region 11.

Next, operation of the protection element 30 will be described. FIG. 5 is a characteristic graph showing characteristics of a withstand voltage of the protection element formed in the semiconductor device according to Embodiment 3. Operation of the protection element 30 is different from operation of the protection element 20 according to Embodiment 2 in the point that the npn parasitic bipolar transistor 33 operates using the n⁻ type drift layer 1 as its collector, the p⁻ type anode region 2 as its base, and the low potential n⁺⁺ type region 31 as its emitter during the operation of the protection element 30. Specifically, when a reverse voltage applied to a first pn junction 14a between the p⁻ type anode region 2 and the n⁻ type drift layer 1 exceeds a breakdown voltage V2, a current (a surge current in a normal time) flows from a cathode side toward the GND pad 7 due to breakdown caused by the first pn junction 14a in the same manner as in Embodiment 1. The current flows into the low potential n⁺⁺ type region 31 at a predetermined voltage (hereinafter referred to as snapback start voltage) V5. Accordingly, the npn parasitic bipolar transistor 33 operates to start snapback. The current flows from the n⁻ type drift layer 1 toward the GND pad 7 through the p⁻ type anode region 2 and the low potential n⁺⁺ type region 31. Therefore, surge current absorbing capability performed by the protection element 30 in the normal time can be increased by the amount of the current flowing into the npn parasitic bipolar transistor 33. The snapback start voltage V5 of the npn parasitic bipolar transistor 33 in the normal time is determined based on impurity concentration of the p⁻ type anode region 2 etc.

Figure 6A:
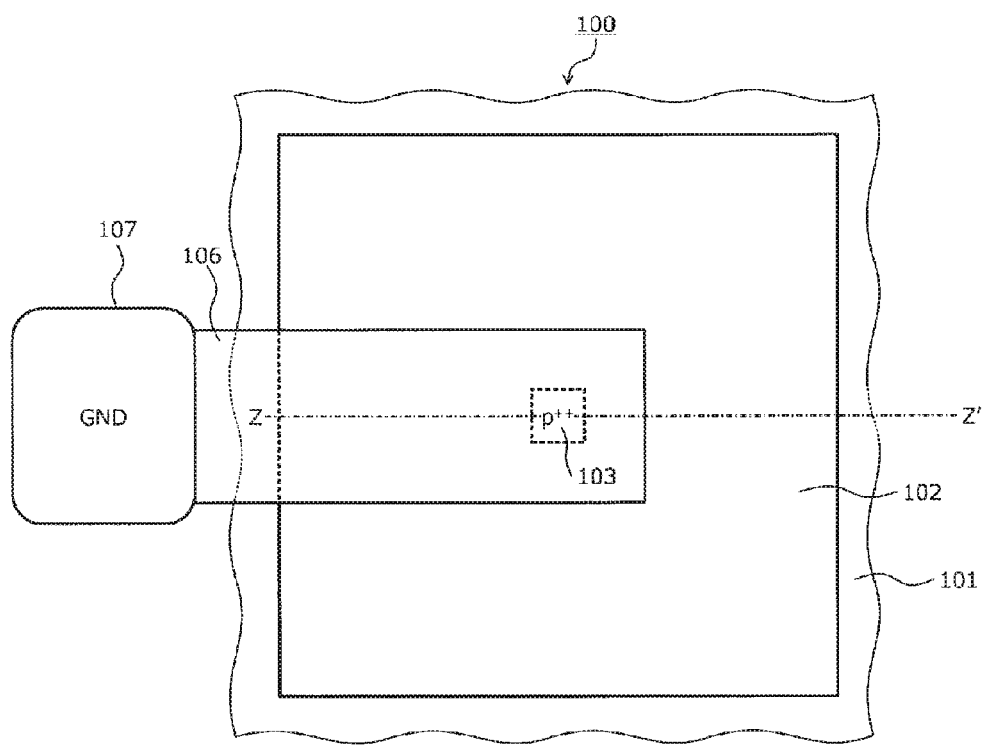
FIGS. 6A and 6B are explanatory views showing the structure of a semiconductor device according to the background art.
Figure 6B:
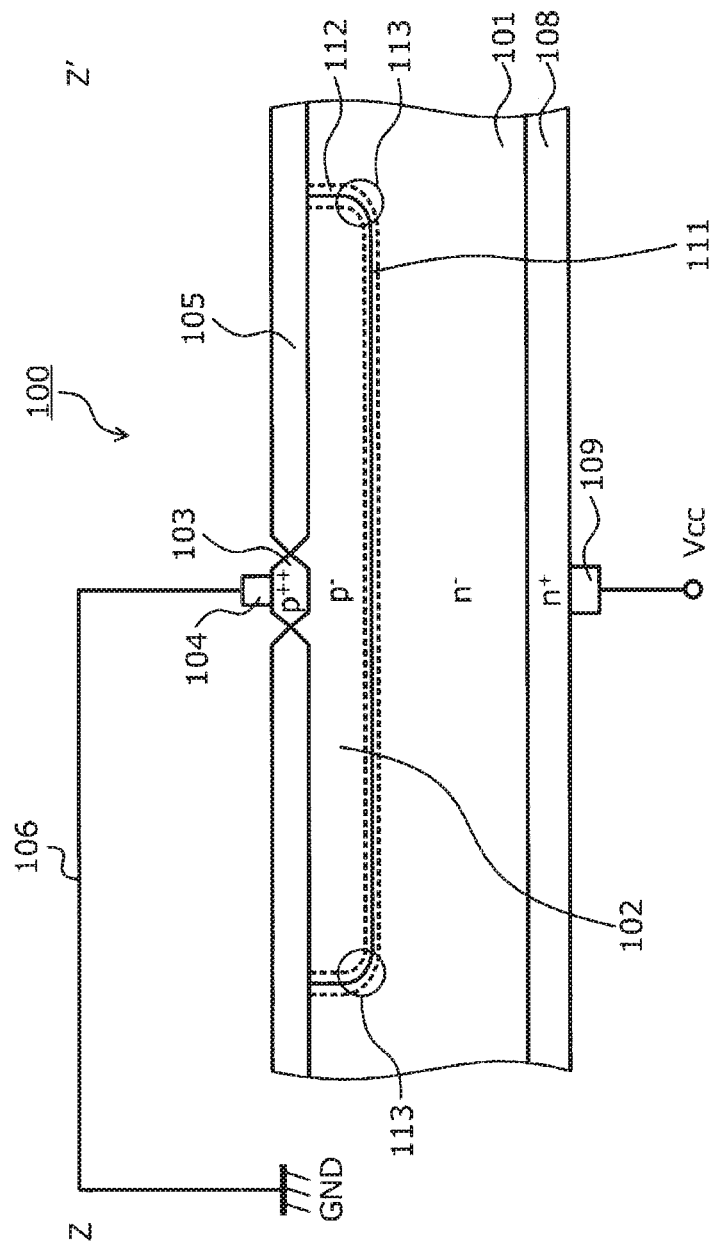

On the other hand, the screening test is originally performed at a screening test voltage at which the protection element 30 does not operate. However, the snapback start voltage V5 of the npn parasitic bipolar transistor 33 in the normal time may be smaller than a screening test voltage V3 (V5<V3) due to a variation of an operating voltage V1 of the device or the breakdown voltage V2 of the protection element 30. In this case, for example, a protection element having a configuration in which a low potential n⁺⁺ type region functioning as an emitter of an npn parasitic bipolar transistor is provided in the protection element 100 according to the background art (see FIGS. 6A and 6B) operates in the screening test time in the same manner as in the aforementioned normal time and the npn parasitic bipolar transistor snaps back. Therefore, there is a fear that a high voltage cannot be applied to any other device than the protection element, which is formed on one and the same semiconductor substrate as the protection element, and the screening test cannot be performed normally. On the other hand, in Embodiment 3, in a time of breakdown caused by the first pn junction 14a, a current flowing into the p⁻ type anode region 2 is limited by a depletion layer 15b spread from a second pn junction 14b between the p⁻ type anode region 2 and the n⁺ type high concentration region 11 in the same manner as in Embodiment 1. Thus, the current flowing into the protection element 30 can be reduced so that a snapback start voltage V6 of the npn parasitic bipolar transistor 33 in the screening test time can be made larger than the snapback start voltage V5 of the npn parasitic bipolar transistor 33 in the normal time (V5<V6). Thus, the snapback start voltage V6 of the npn parasitic bipolar transistor 33 in the screening test time can be set to be larger than the screening test voltage V3 (V3<V6). Accordingly, the npn parasitic bipolar transistor 33 does not snap back in the screening test time. For this reason, the current is not absorbed by the protection element 30 in the screening test time so that a high screening test voltage V3 can be applied to any other device than the protection element 30. Further, a breakdown place can be surely limited to a corner portion 16 of the p⁻ type anode region 2 by the n⁺ type high concentration region 11 provided in the vicinity of the outer circumference of the p⁻ type anode region 2 in the same manner as in Embodiment 2. Accordingly, the current flowing into the p⁻ type anode region 2 in the screening test time can be controlled more effectively. The snapback start voltage V6 of the npn parasitic bipolar transistor 33 in the screening test time is determined based on impurity concentration of the p⁻ type anode region 2 and impurity concentration of the n⁺ type high concentration region 11, etc.

According to Embodiment 3 as described above, a current flowing into the protection element in the screening test time can be suppressed in the same manner as in Embodiment 1 or 2 also in the case where the npn parasitic bipolar transistor is formed in the protection element to increase surge current absorbing capability. Therefore, the npn parasitic bipolar transistor of the protection element can be prevented from snapping back in the screening test time so that a high screening test voltage can be applied to any other device than the protection element. In addition, the current flowing into the protection element in the screening test time can be suppressed so that the protection element can be prevented from generating heat to lead to breakdown. Accordingly, the same effect as that in Embodiment 1 or 2 can be obtained.

In the above description, the invention is not limited to the aforementioned embodiments but may be changed variously without departing from the spirit and scope of the invention. For example, Embodiment 3 may be applied to Embodiment 1 so that a low potential n⁺⁺ type region functioning as an emitter of an npn parasitic bipolar transistor can be provided inside the p⁻ type anode region of the protection element according to Embodiment 1. In addition, the invention can be applied to a semiconductor device in which various devices (elements) constituting a circuit portion and a protection element protecting these devices from surge are provided on one and the same semiconductor substrate. Moreover, although the p⁻ type anode region is selectively provided in the front surface layer of the n⁻ type semiconductor substrate in each of the aforementioned embodiments, a p⁻ type epitaxial layer serving as a p⁻ type anode region may be provided in the front surface of the n⁻ type semiconductor substrate. Moreover, even when the conductive types (n-type and p-type) are reversed, the invention is also established.

As described above, the semiconductor device according to the invention is useful for a semiconductor device in which a device constituting a circuit portion and a protection element protecting the device from surge are provided on one and the same semiconductor substrate, and a method for testing the semiconductor device. Particularly, the semiconductor device according to the invention is suitable for a screening test of the semiconductor device.

What is claimed is:

1. A semiconductor device, comprising:
a diode in which a second-conductive-type first semiconductor region is selectively provided in a front surface layer of a first-conductive-type semiconductor substrate;
a second-conductive-type second semiconductor region which is higher in impurity concentration than the first semiconductor region and which is selectively provided inside the first semiconductor region;
a first-conductive-type third semiconductor region which is selectively provided inside the first semiconductor region, separately from the second semiconductor region and outside the second semiconductor region;
a first electrode which is electrically connected to the second semiconductor region and connected to a first potential;
a second electrode which is electrically connected to the semiconductor substrate and connected to a second potential which is higher than the first potential; and
a third electrode of a floating potential which is electrically connected to the third semiconductor region.

2. The semiconductor device according to claim 1, further comprising a second-conductive-type fourth semiconductor region which is higher in impurity concentration than the first semiconductor region and which is selectively provided inside the first semiconductor region, separately from the third semiconductor region, and outside the third semiconductor region.

3. The semiconductor device according to claim 2, further comprising a first-conductive-type fifth semiconductor region which is selectively provided between the second semiconductor region and the third semiconductor region inside the first semiconductor region; and a fourth electrode which is electrically connected to the fifth semiconductor region and connected to the first potential.

4. The semiconductor device according to claim 3, further comprising a semiconductor element which has a withstand voltage that is higher than that of the diode and which is provided on one and the same semiconductor substrate as the diode,
wherein, in a test time for checking characteristics of the semiconductor element, the third electrode is connected to a third potential higher than the first potential, and a predetermined voltage is applied to the semiconductor element through the second electrode.

5. The semiconductor device according to claim 3, further comprising a semiconductor element which has a withstand voltage that is higher than that of the diode and which is provided on one and the same semiconductor substrate as the diode,
wherein, in a test time for checking characteristics of the semiconductor element, the third electrode is connected to a third potential higher than the first potential, and a predetermined voltage is applied to the semiconductor element through the second electrode, and
wherein the second semiconductor region has an impurity concentration and the third semiconductor has an impurity concentration, and
wherein at least one of the impurity concentration of the second semiconductor region and the impurity concentration of the third semiconductor region is set so that a parasitic bipolar diode including the semiconductor substrate, the second semiconductor region and the fifth semiconductor region can snap back at a voltage that is higher than the predetermined voltage in the test.

6. The semiconductor device according to claim 2, further comprising a semiconductor element which has a withstand voltage that is higher than that of the diode and which is provided on one and the same semiconductor substrate as the diode,
wherein, in a test time for checking characteristics of the semiconductor element, the third electrode is connected to a third potential higher than the first potential, and a predetermined voltage is applied to the semiconductor element through the second electrode.

7. The semiconductor device according to claim 1, further comprising a first-conductive-type fifth semiconductor region which is selectively provided between the second semiconductor region and the third semiconductor region inside the first semiconductor region; and a fourth electrode which is electrically connected to the fifth semiconductor region and connected to the first potential.

8. The semiconductor device according to claim 7, further comprising a semiconductor element which has a withstand voltage that is higher than that of the diode and which is provided on one and the same semiconductor substrate as the diode,
wherein, in a test time for checking characteristics of the semiconductor element, the third electrode is connected to a third potential higher than the first potential, and a predetermined voltage is applied to the semiconductor element through the second electrode.

9. The semiconductor device according to claim 7, further comprising a semiconductor element which has a withstand voltage that is higher than that of the diode and which is provided on one and the same semiconductor substrate as the diode,
wherein, in a test time for checking characteristics of the semiconductor element, the third electrode is connected to a third potential higher than the first potential, and a predetermined voltage is applied to the semiconductor element through the second electrode, and
wherein the second semiconductor region has an impurity concentration and the third semiconductor has an impurity concentration, and
wherein at least one of the impurity concentration of the second semiconductor region and the impurity concentration of the third semiconductor region is set so that a parasitic bipolar diode including the semiconductor substrate, the second semiconductor region and the fifth semiconductor region can snap back at a voltage that is higher than the predetermined voltage in the test.

10. The semiconductor device according to claim 1, further comprising a semiconductor element which has a withstand voltage that is higher than that of the diode and which is provided on one and the same semiconductor substrate as the diode,
wherein, in a test time for checking characteristics of the semiconductor element, the third electrode is connected to a third potential higher than the first potential, and a predetermined voltage is applied to the semiconductor element through the second electrode.

11. The semiconductor device according to claim 1, wherein the diode and a semiconductor element having a withstand voltage that is higher than that of the diode are provided on one and the same first conductive type semiconductor substrate, and wherein in a test time for checking characteristics of the semiconductor element, a first potential is applied to the second-conductive-type second semiconductor region;

a second potential that is higher than the first potential is applied to the semiconductor substrate to thereby apply a predetermined voltage to the semiconductor element; and a third potential that is higher than that of the first potential is applied to the first-conductive-type third semiconductor region.

12. The semiconductor device according to claim 11, wherein the predetermined voltage is higher than a reverse voltage at which the diode may break down.

13. A semiconductor device, comprising:

a diode in which a second-conductive-type first semiconductor region is selectively provided in a front surface layer of a first-conductive-type semiconductor substrate;

a second-conductive-type second semiconductor region which is higher in impurity concentration than the first semiconductor region and which is selectively provided inside the first semiconductor region;

a first-conductive-type third semiconductor region which is selectively provided inside the first semiconductor region, separately from the second semiconductor region and outside the second semiconductor region;

a first electrode which is electrically connected to the second semiconductor region and connected to a first potential;

a second electrode which is electrically connected to the semiconductor substrate and connected to a second potential; and a third electrode of a floating potential which is electrically connected to the third semiconductor region.

* * * * *